United States Patent
Barina et al.

(10) Patent No.: US 7,307,835 B1
(45) Date of Patent: Dec. 11, 2007

(54) COMPUTER MODULE CONNECTION

(75) Inventors: Richard M. Barina, Sebring, FL (US); David L. Hager, Wake Forest, NC (US); Daniel P. Kelaher, Holly Springs, NC (US); Anthony Wayne Miles, Raleigh, NC (US); Glenn E. Myrto, Holly Springs, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/465,476

(22) Filed: Aug. 18, 2006

(51) Int. Cl.
*G06F 1/16* (2006.01)

(52) U.S. Cl. ............................ 361/684; 248/917; 700/277

(58) Field of Classification Search ............... 70/20, 70/277, 282; 296/37.8; 711/122; 248/917; 340/635; 361/679–687, 724–727
See application file for complete search history.

(56) References Cited

U.S. PATENT DOCUMENTS

| | | | |
|---|---|---|---|
| 2002/0093785 A1 | 7/2002 | Chi et al. ................. | 361/679 |
| 2003/0016515 A1 | 1/2003 | Jackson et al. ............ | 361/796 |
| 2003/0193781 A1 | 10/2003 | Mori ........................ | 361/725 |
| 2004/0027808 A1* | 2/2004 | Rumney .................... | 361/724 |
| 2005/0038529 A1* | 2/2005 | Perez et al. ............... | 700/19 |
| 2005/0157461 A1 | 7/2005 | Cauthron .................. | 361/683 |
| 2007/0075559 A1* | 4/2007 | Sturt ........................ | 296/37.8 |

* cited by examiner

*Primary Examiner*—Hung Van Duong
(74) *Attorney, Agent, or Firm*—Harrington & Smith, PC

(57) ABSTRACT

A computer drive module including at least one computer drive; a module housing; and a backplane printed circuit board. The module housing includes a first section adapted to be connected to a computer housing and a second section movably connected to the first section between a retracted position and an extended position. The second section is adapted to pivot relative to the first section when the second section is at the extended position. The backplane printed circuit board is connected to a rear end of the second section of the module housing.

20 Claims, 13 Drawing Sheets

COMPUTER MODULE CONNECTION

BACKGROUND OF THE INVENTION

1. Field of the Invention

The invention relates to a computer and, more particularly, to a computer module connection.

2. Brief Description of Prior Developments

A problem exists with large server computers in that the different modules of the server need to be accessed for upgrade and service. Many times subsystems and modules get buried underneath other subsystems and modules which make service and customer upgrade tasks much more difficult in the field. Hard drive cages are one such type of module that also require access to the rear of the module for customer upgrade or service.

Previous systems typically address the problem in either of two methods. First, access from above the hard drive cage is often provided to allow the customer or servicer to access the hard drive backplane on the rear of the cage from above the system. However this solution requires that access be provided above the hard drive cage. Second, access to internal components on modules can be provided by removing the module from the system entirely and working on the module on a separate work surface. This works well when one can exchange out the entire module for upgrade or replacement. However, work surfaces are rare in data centers, and drive cages are often so compact that the electronic boards prevent the cage from being placed on a work surface to be serviced. The backplane can be permanently fastened to the cage itself, so if the backplane needs to be replaced, the entire cage needs to be replaced.

A solution is needed that solves all of these limitations. It should also provide the ability to upgrade or service internal components of a computer module when there is no access from above the module; in a serviceable position without having to remove the entire module and take it to another work surface to perform service on it. However, it should also be easy to remove the entire module in the case of a technology upgrade by the customer.

SUMMARY OF THE INVENTION

In accordance with one aspect of the invention, a computer drive module is provided including at least one computer drive; a module housing; and a backplane printed circuit board. The module housing includes a first section adapted to be connected to a computer housing and a second section movably connected to the first section between a retracted position and an extended position. The second section is adapted to pivot relative to the first section when the second section is at the extended position. The backplane printed circuit board is connected to a rear end of the second section of the module housing.

In accordance with another aspect of the invention, a computer module is provided comprising a module housing adapted to be movably mounted in a receiving area of a computer housing; and a combined latch and lever assembly movably mounted to the module housing. The combined latch and lever assembly comprises a latch member adapted to latch the computer module to the computer housing at a connected position and a lever member pivotably connected to the module housing. When the lever member is rotated the lever member is adapted to move the latch member from a latched position to an unlatched position, and the lever member comprises a cam surface adapted to cam the lever member in a direction away from the computer housing and thereby cam the module housing in the direction away from the computer housing.

In accordance with another aspect of the invention, a computer server is provided comprising a housing having a computer module receiving area adapted to removably receive a computer module therein; a backplane direct docking connector mounting section; and a cable management arm. The backplane direct docking connector mounting section is connected to the housing at a rear of the computer module receiving area. The backplane direct docking connector mounting section is adapted to have at least one optional electrical connector mounted thereto to plug with a mating electrical connector of the computer module when the computer module is plugged into the computer module receiving area. The cable management arm is movably connected to the housing at the rear of the computer module receiving area. The cable management arm is adapted to hold an optional electrical cable, connected between the computer server and the computer module, and controllably locate the electrical cable with movement of the cable management arm between a retracted position and an extended position.

BRIEF DESCRIPTION OF THE DRAWINGS

The foregoing aspects and other features of the invention are explained in the following description, taken in connection with the accompanying drawings, wherein.

DETAILED DESCRIPTION OF THE PREFERRED EMBODIMENT

Figure 1:
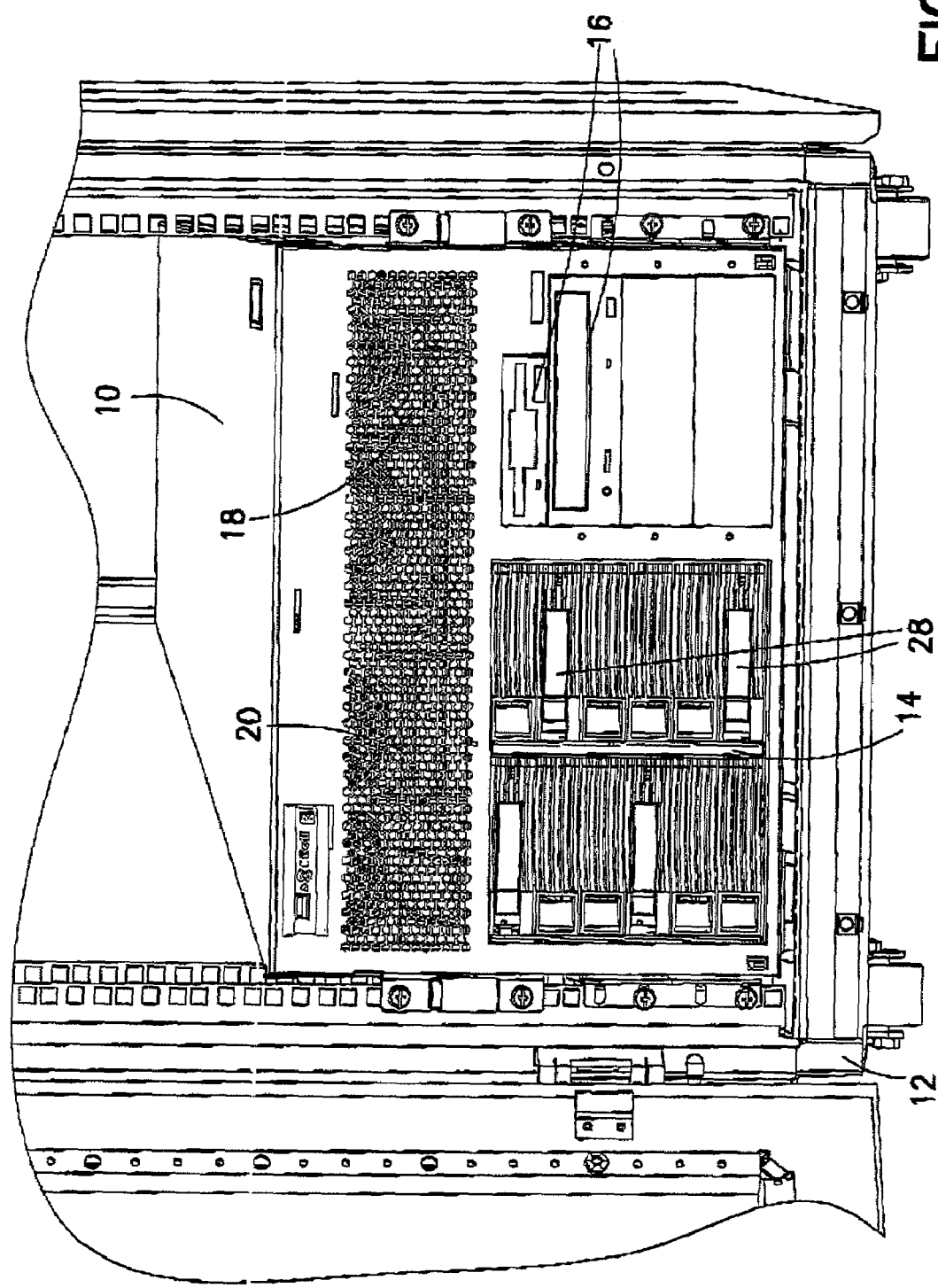
FIG. 1 is a perspective view of a server computer in a server cabinet.

Referring to FIG. 1, there is shown a perspective view of a server computer 10 incorporating features of the invention shown in a server cabinet 12. Although the invention will be described with reference to the exemplary embodiment shown in the drawings, it should be understood that the invention can be embodied in many alternate forms of embodiments. In addition, any suitable size, shape or type of elements or materials could be used.

The server computer 10 is a modular server computer which contains power modules, a storage module 14, input/out modules 16, memory modules 18, and a processor module 20. It can be seen that the storage module 14 is located on the bottom half of the system and no access is provided to the module 14 from above due to the location of the processor and memory modules 18, 20. The storage module 14 comprises at least one hard drive or similar storage drive.

Figure 2:
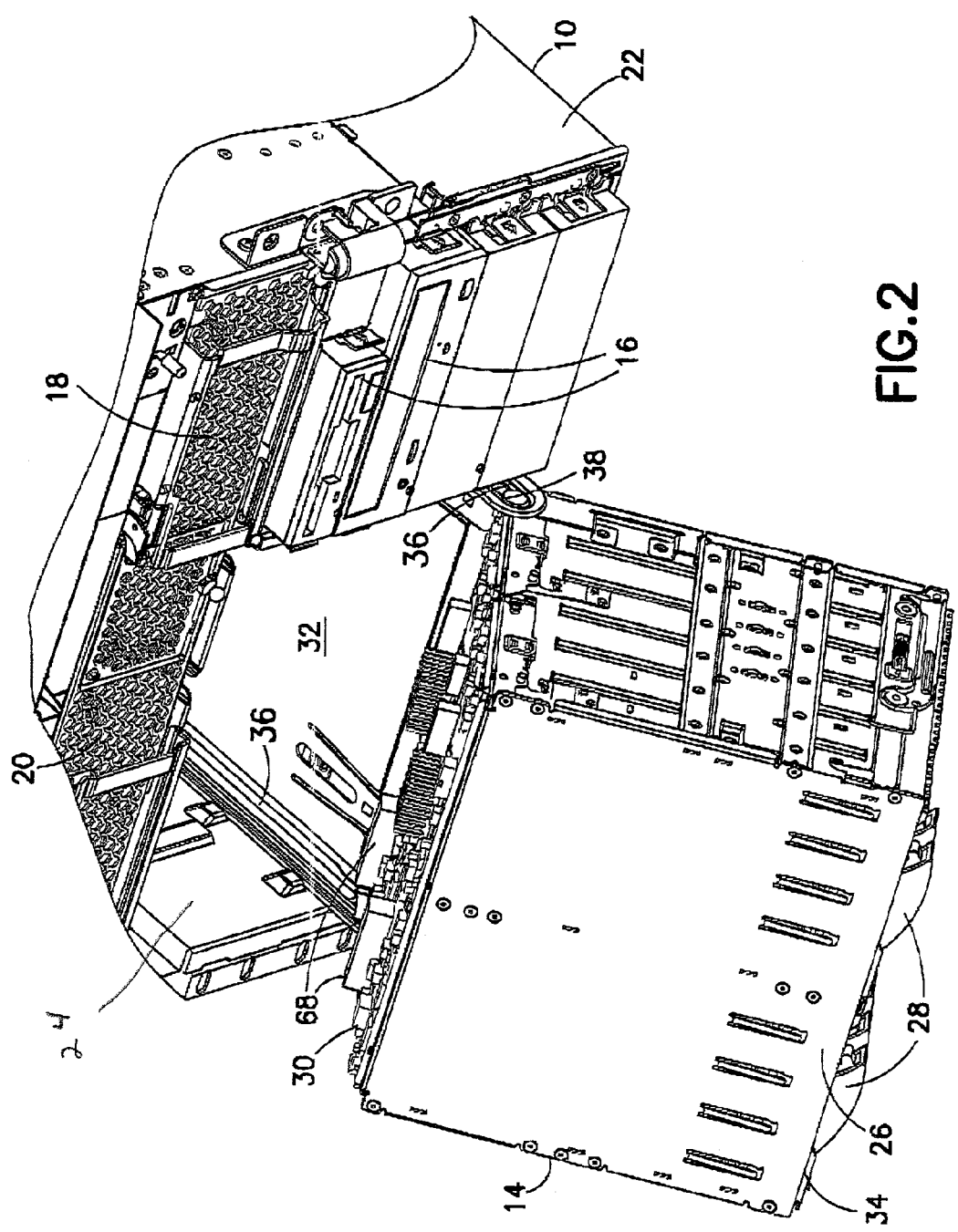
FIG. 2 is a perspective view of the server computer shown in FIG. 1 with the front housing bezel removed and a section of the storage module moved to an extended position.

Referring also to FIG. 2, the computer 10 comprises a server housing 22 which removably houses the various modules. The server housing 22 includes a storage module receiving area 24. The storage module receiving area 24 has an open front end which allows insertion and removal of the storage module 14 in the receiving area 24. FIG. 2 shows the front bezel of the computer 10 removed to expose the various modules, and the storage module 14 moved to a servicing position primarily out of the receiving area 24. The storage module 14 generally comprises a module housing 26, storage drives 28, and a backplane printed circuit board 30. In the embodiment shown, the module housing 26 is adapted to house twelve of the storage drives 28, and four of the storage drives are shown installed in FIG. 1 and eight are shown installed in FIG. 10. However, any suitable number or capability could be provided. In addition, features of the invention could be used with a module other than a storage module.

The module housing 26 generally comprises a first section 32 and a second section 34. The first section 32 is adapted to be removably connected to the computer housing 22 at a bottom of the receiving area 24. In an alternate embodiment the first section 32 could be non-removably connected to the computer housing 22, or could be an integral part of the computer housing 22. The second section 34 forms a hard drive cage which houses the storage drives 28 and has a general box shape which is adapted to be plugged into the receiving area 24.

A movable connection is provided between the first section 32 and the second section 34. More specifically, the second section 34 is movable relative to the first section 32 between a retracted position as shown in FIG. 1 and an extended position as shown in FIG. 2. In the retracted position the second section is located inside the receiving area 24 in its fully connected position. The movable connection, in this embodiment, comprises the first section 32 having rails or tracts 36 and the second section 34 having pins or rollers 38. The rollers 38 are located at the bottom rear of the second section 34 and are adapted to ride on the tracts 36. This provides a sliding connecting of the second section 34 to the first section 32. The connection of the second section 34 to the first section 32 also provides a pivoting connection when the second section 34 is moved to the extended position. As seen in FIG. 2, when the second section 34 is moved to the extended position the second section 34 can be rotated downward to allow greater access to the backplane 30 from above. This allows easier servicing of the backplane 30.

Figure 4:
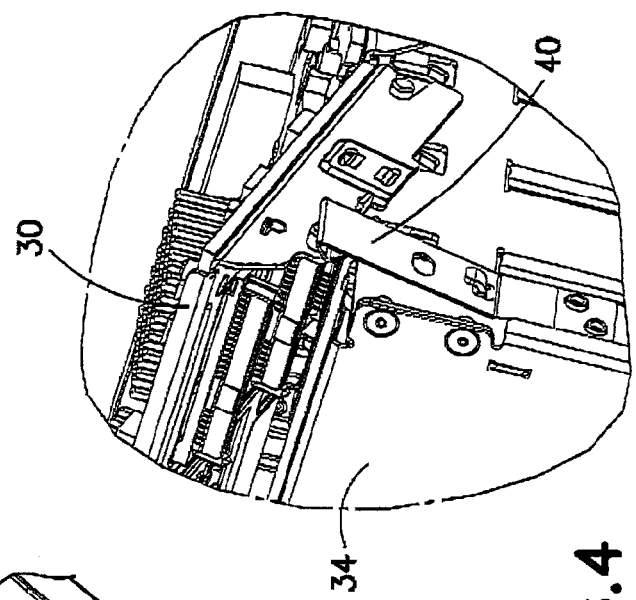
FIG. 4 is an enlarged view of area 4 in FIG. 3.
Figure 3:
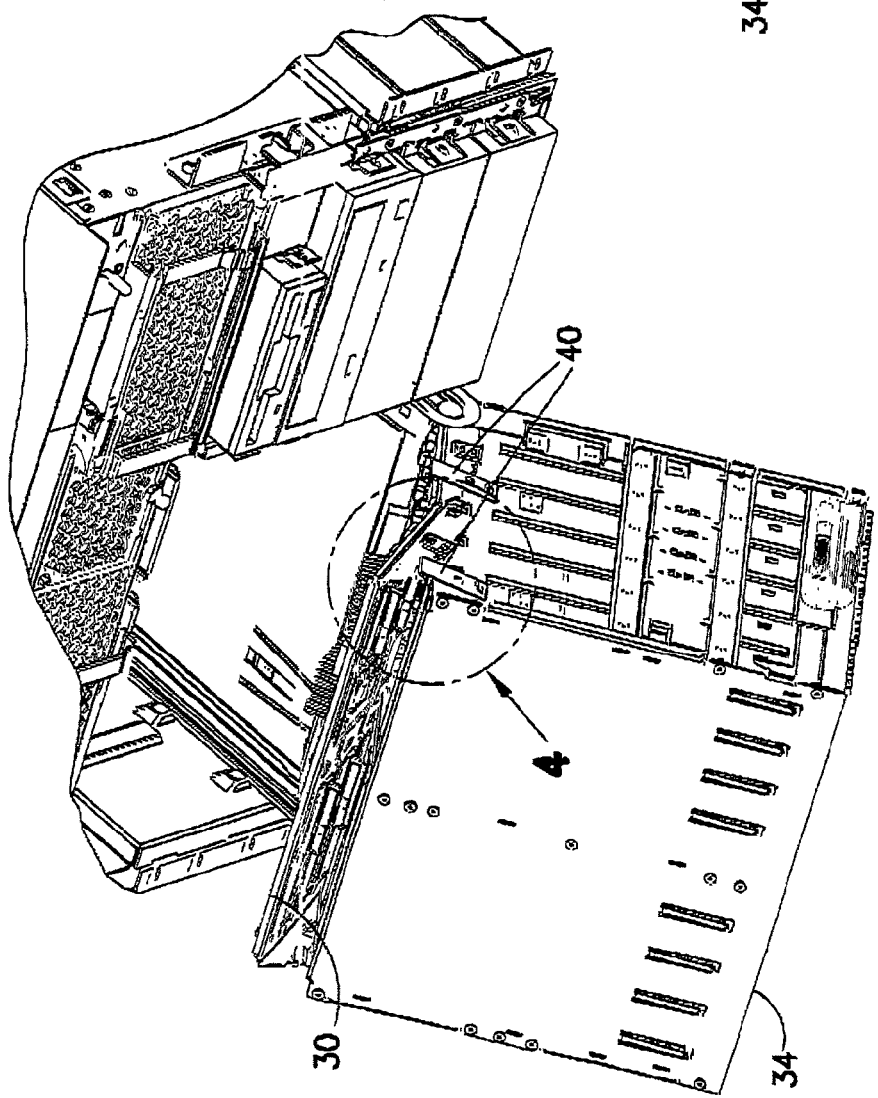
FIG. 3 is a perspective view as in FIG. 2 with the backplane moved to a rotated position for removal.

Referring also to FIGS. 3 and 4, the backplane 30 is connected to the rear of the second section 34 by spring clips 40. As seen in comparing FIG. 3 to FIG. 2, the hard drive backplane 30 can be rotated away from the hard drive cage 34 so that the backplane 30 can be removed without the need for any tools. The spring clips 40 can be metal spring steel latches which hold the backplane 30 onto the drive cage 34 during normal operation. However, in alternate embodiments any suitable connection for connecting the backplane 30 to the second section 34 could be provided.

Figure 5:
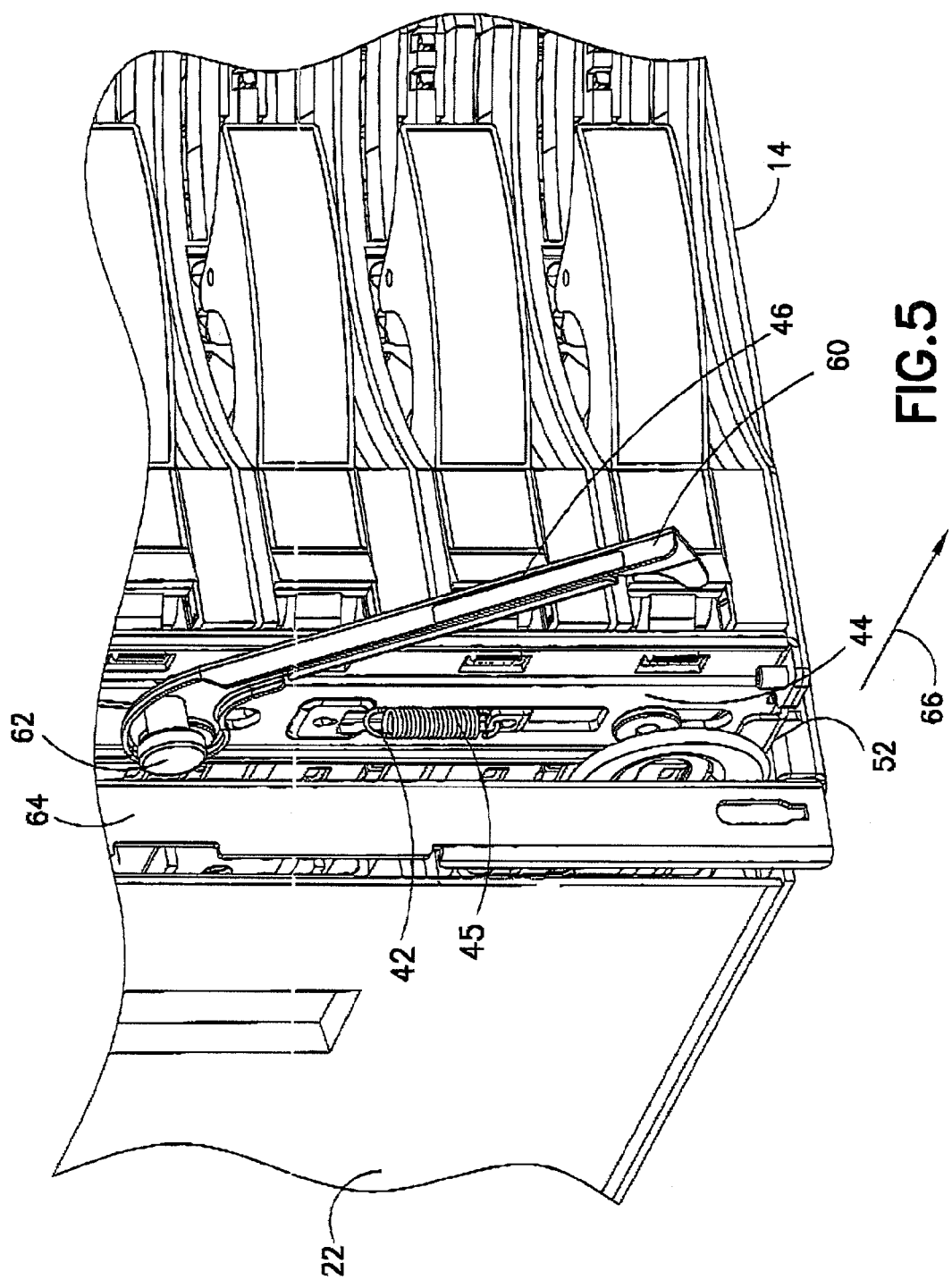
FIG. 5 is an enlarged partial perspective view of the combined latch and lever assembly of the storage module shown in FIGS. 1 and 2.
Figure 6:
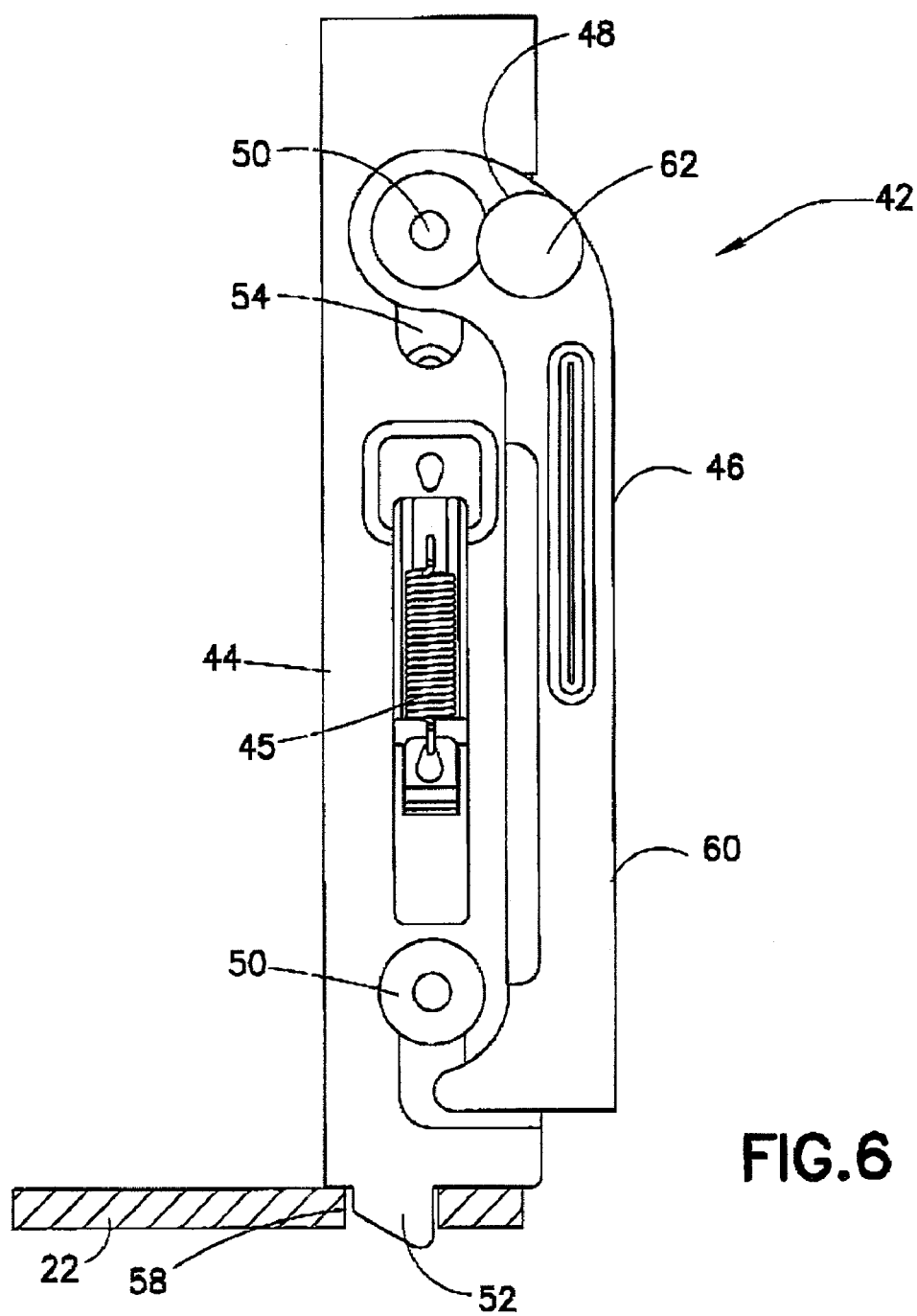
FIG. 6 is a side view of the combined latch and lever assembly shown in FIG. 5 in a latched position.
Figure 7:
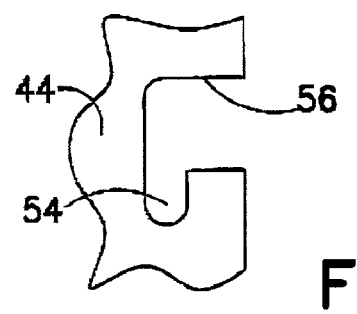
FIG. 7 is a partial side view of a portion of the latch member of the assembly shown in FIG. 6.

Referring also to FIG. 5, the storage module 14 includes a combined latch and lever assembly 42. The assembly 42 is connected to an exterior lateral side of the second section 34. The assembly generally comprises a latch member 44 and a lever member 46. Referring also to FIGS. 6-7, the latch member 44 is slidably connected to the second section 34 on mounting pins 50 between up and down positions. A spring 45 biases the latch member 44 in a down position. The top mounting pin 50 also serves as a pivot pin for pivotably mounting the lever member 46 to the second section 34. The bottom end of the latch member 44 comprises a latch projection 52. The top pin slot 54 comprises a cam surface 56. The latch member 44 is adapted to latch the second section 34 of the computer module 14 to the computer housing 22 at the connected position shown in FIG. 1. More specifically, the latch projection 52 can latch in the latch slot 58 of the second section 34 to lock the second section 34 at its retraction position in the receiving area 24. However, the latch member 44 can be moved up to disengage the latch projection 52 from the latch slot 58 to allow the second section 34 to be moved to the extended position.

Figure 8:
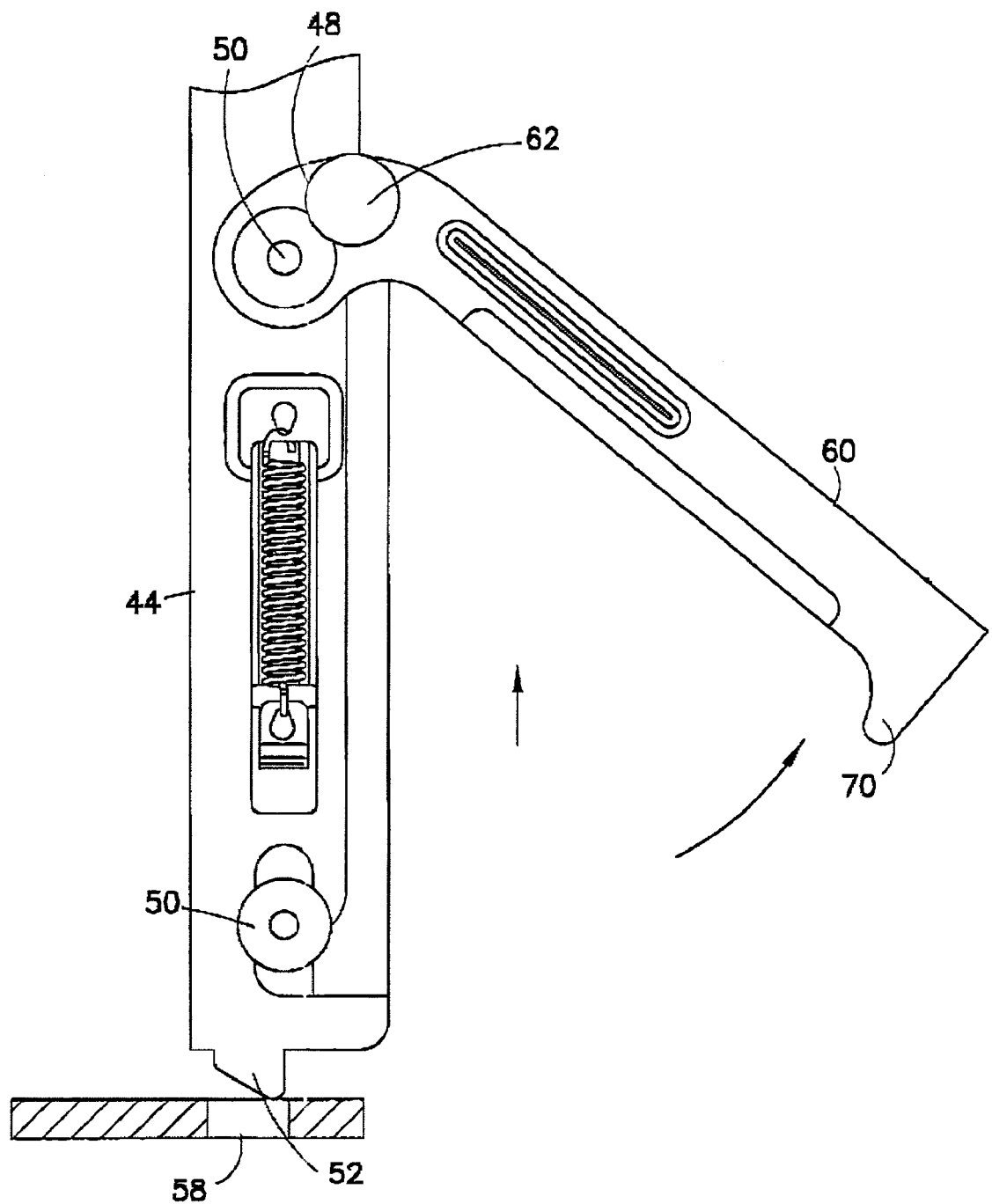
FIG. 8 is a side view as in FIG. 6 with the handle section moved to an unlatching position.

The lever member 46 is pivotably connected to the module housing 34 at the top pin 50. Referring also to FIG. 8, when the lever member 46 is rotated the lever member 46 is adapted to move the latch member 44 from a latched position (FIG. 6) to an unlatched position (FIG. 8). More specifically, the lever member comprises a handle section 60 and a cam section or camming pin 62. The handle section 60 forms a convenient section for a user to grasp and control movement of the lever member. As the handle section 60 is rotated, such as the first 30 degrees for example, the handle section lifts and rotates the camming pin 62. A portion of the camming pin 62 located in the top pin slot 54 engages the cam surface 56 of the latch member 44 and lifts the latch member 44 up. As seen in FIG. 8, this disengages the latch projection 52 from the latch slot 58.

Figure 9:
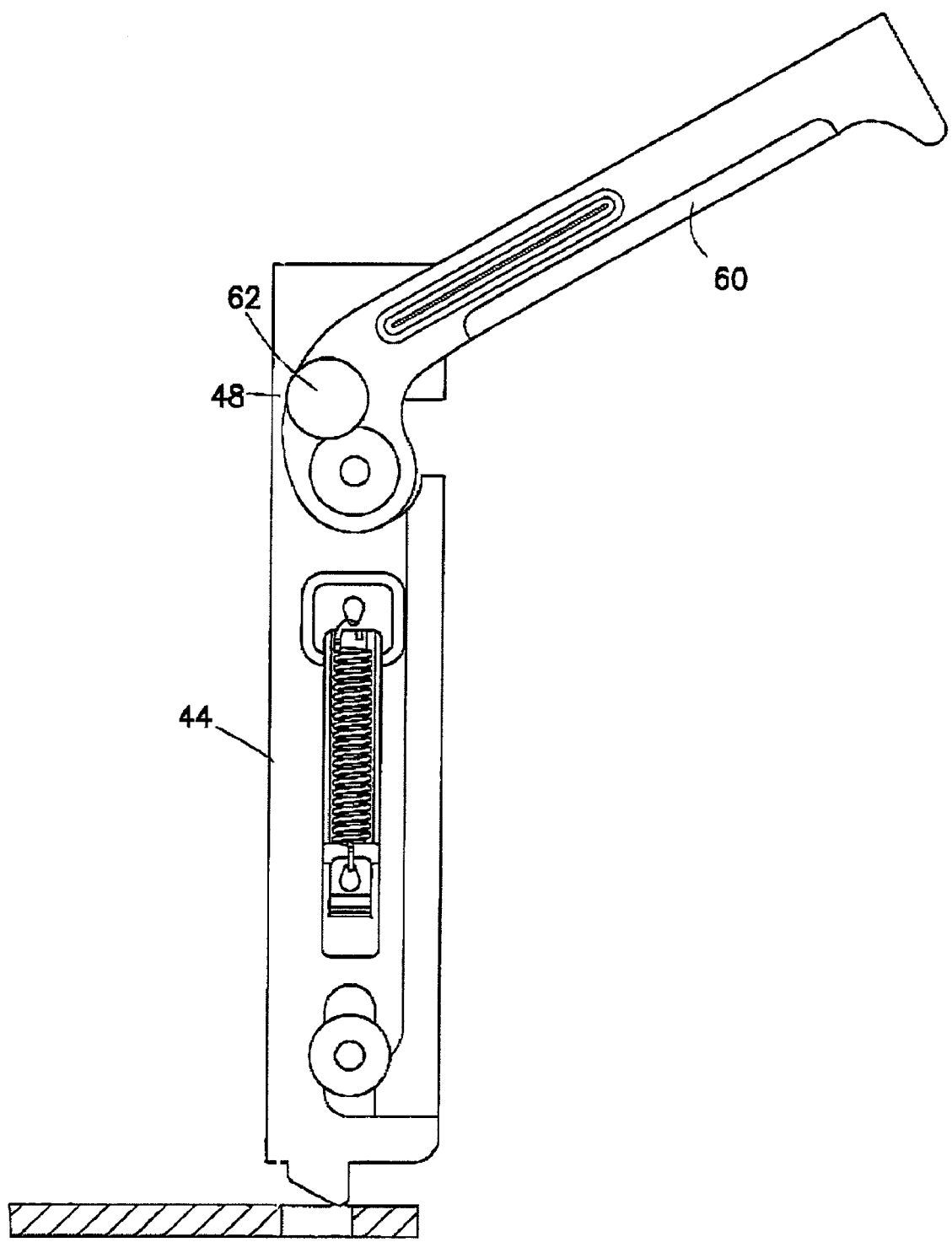
FIG. 9 is a side view as in FIG. 6 with the handle section moved to a camming position.
Figure 10:
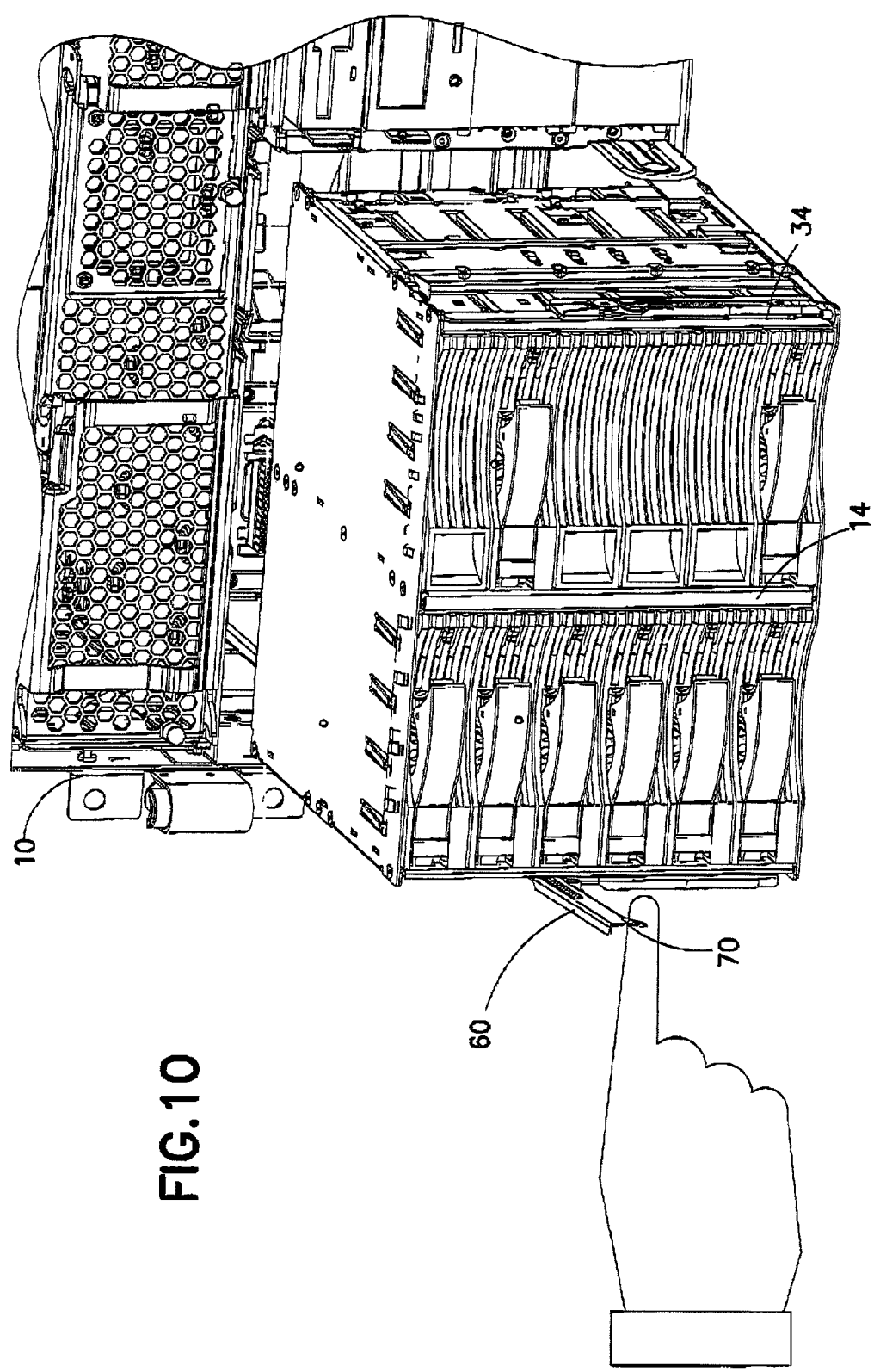
FIG. 10 is a perspective view showing a user pulling the storage module out of the computer housing by use of the handle section of the assembly shown in FIG. 6.

The lever member 46 comprises a cam surface 48 on the camming pin 62 adapted to cam the lever member 46 in a direction away from the computer housing 22 and thereby cam the module housing 34 in the direction away from the computer housing 22. Referring also to FIGS. 9 and 5, as the handle section 60 is rotated further, the camming pin 62 can contact a portion 64 of the server housing 22 and cam the drive cage 34 outward from the receiving area 24 in direction 66. This causes the electrical connectors 68 (see FIG. 2) on the backplane 30 to disconnect from the direct-docking internal connectors (80; see FIG. 14) of the computer 10 located in the rear of the receiving area 24. Referring also to FIG. 10, the hook feature 70 on the end of the handle section 60 then allows the operator to easily grasp it and pull the drive cage 34 out of the system for service as shown in FIGS. 10 and 2.

Figure 11:
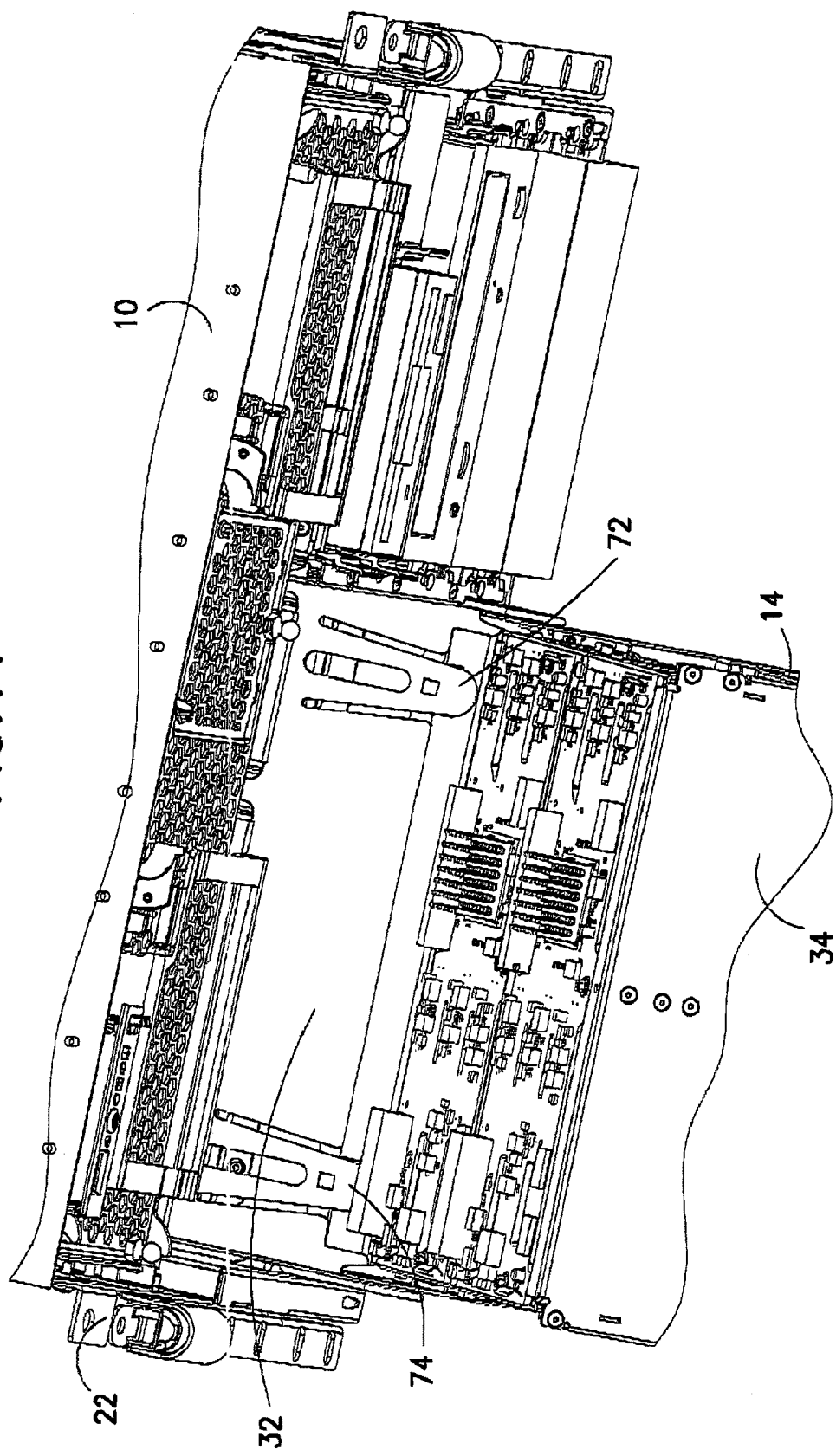
FIG. 11 is a partial perspective view of the module and computer as shown in FIG. 2 showing the retained connection of a section of the module to the computer housing.
Figure 12:
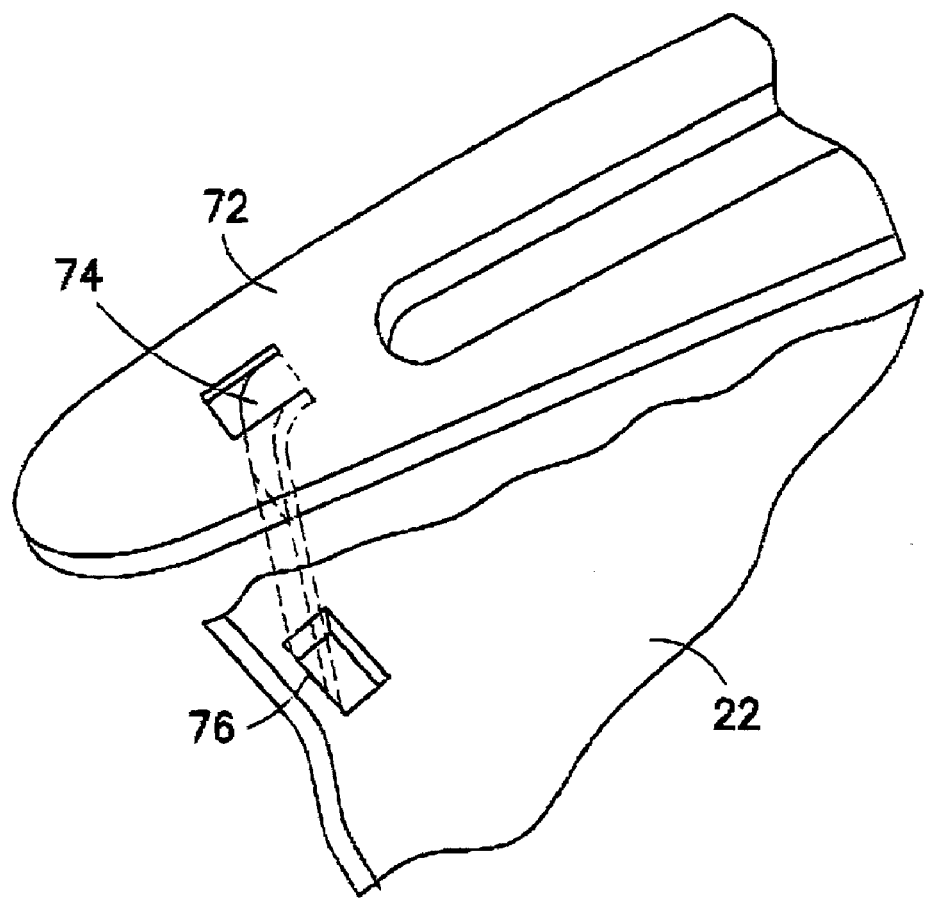
FIG. 12 is a partial exploded perspective view of the retained connection shown in FIG. 11.
Figure 13:
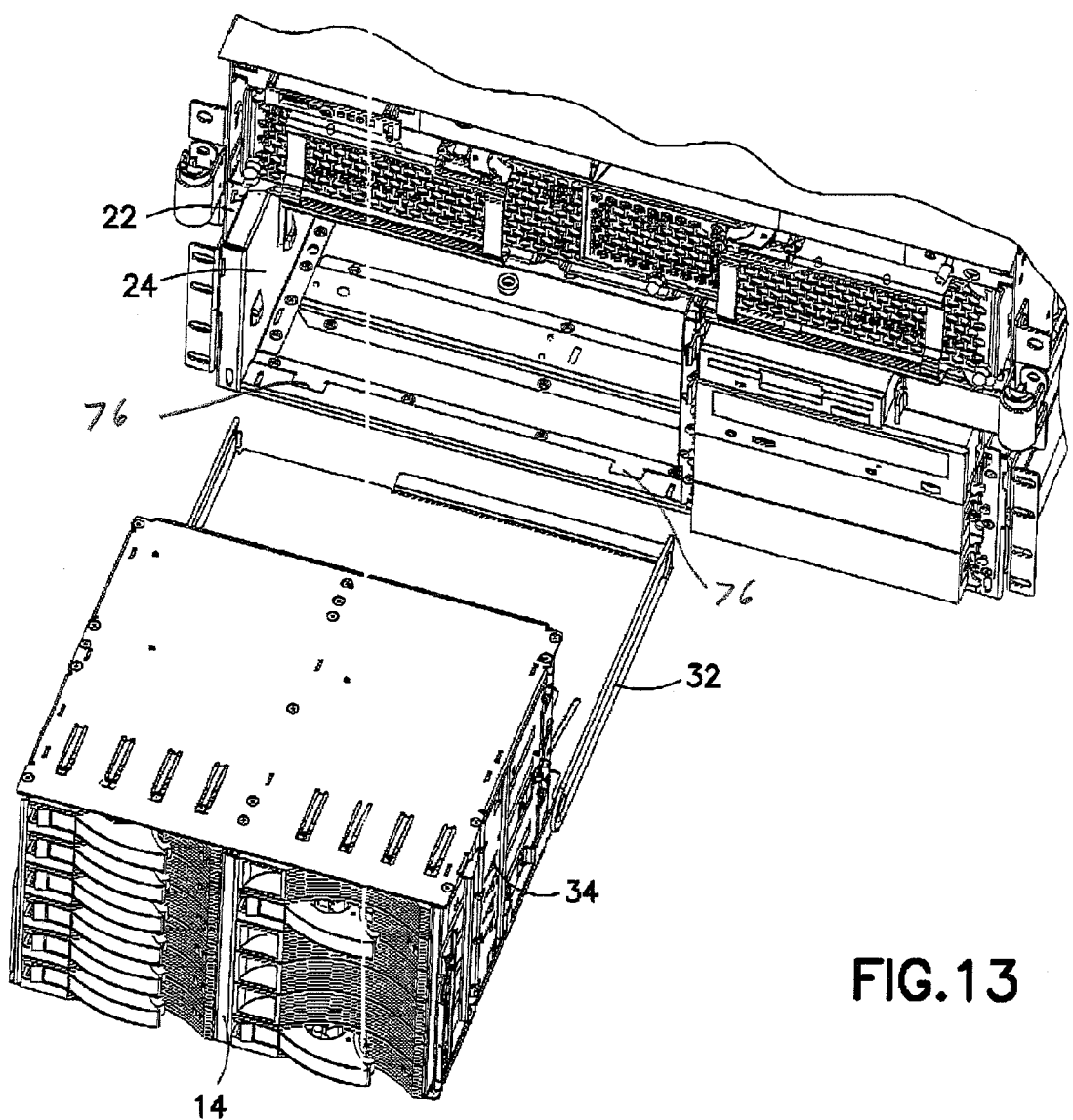
FIG. 13 is a perspective view showing disconnection of the storage module from the computer shown in FIG. 2.

Referring also to FIGS. 11-13, in this embodiment the storage module 14 is removable from the computer housing 22 without the use of any tools. However, in an alternate embodiment the use of tools might be required. As noted above, the first section 32 is fixedly connected to the computer housing 22 in a stationary position. Part of the connection includes latches 72. The first section 32 is comprised of sheet metal which is stamped and formed. The latches 72 are formed from the sheet metal of the first section 32. More specifically, the front end of the first section 32 has two of the latches 72 which extend forward in a general cantilevered fashion and comprise downward extending projections 74. The computer housing 22 has slots 76 which are adapted to receive the projections 74. When the projections 74 are located in the slots 76, the first section 32 is fixedly, stationarily held in the receiving area 24. The latches 72 can be resiliently deflected upward by a user to disengage the projections 74 from the slots 76 and thereby remove the first section 32 from the receiving area 24 as shown in FIG. 13. Thus, the entire storage module 14 can be removed and replaced if desired.

One of the advantages of the invention is that it allows tool-less service. The use of a tool is not required to disconnect and move the storage module 14 from its normal position shown in FIG. 1 to a service position shown in FIG. 2. In addition, the use of a tool is not required to disconnect and remove the storage module 14 from the computer server 10 as shown in FIG. 13. This makes servicing, as well as initial manufacturing, faster. This also makes manufacturing less expensive (because less parts are needed and less time is needed to assemble the parts). This also makes servicing less expensive because less time is needed for servicing (because it takes less time move and/or remove the module 14 than if a tool-required design was used).

Another advantage of the invention is that the assembly of the module 14, and the assembly of the module 14 with the server computer 10, is very robust. This is advantageous because the drives 28 are heavy and somewhat sensitive, and the module 14 is being moved during servicing. Thus, because the drives 28 are heavy and somewhat sensitive, and the module 14 is being moved during servicing, the robust design of the invention prevents damage to the drives and/or the frame of the module 14. The assembly also preferably comprises EMC spring contacts (shown on top in FIG. 2).

Figure 14:
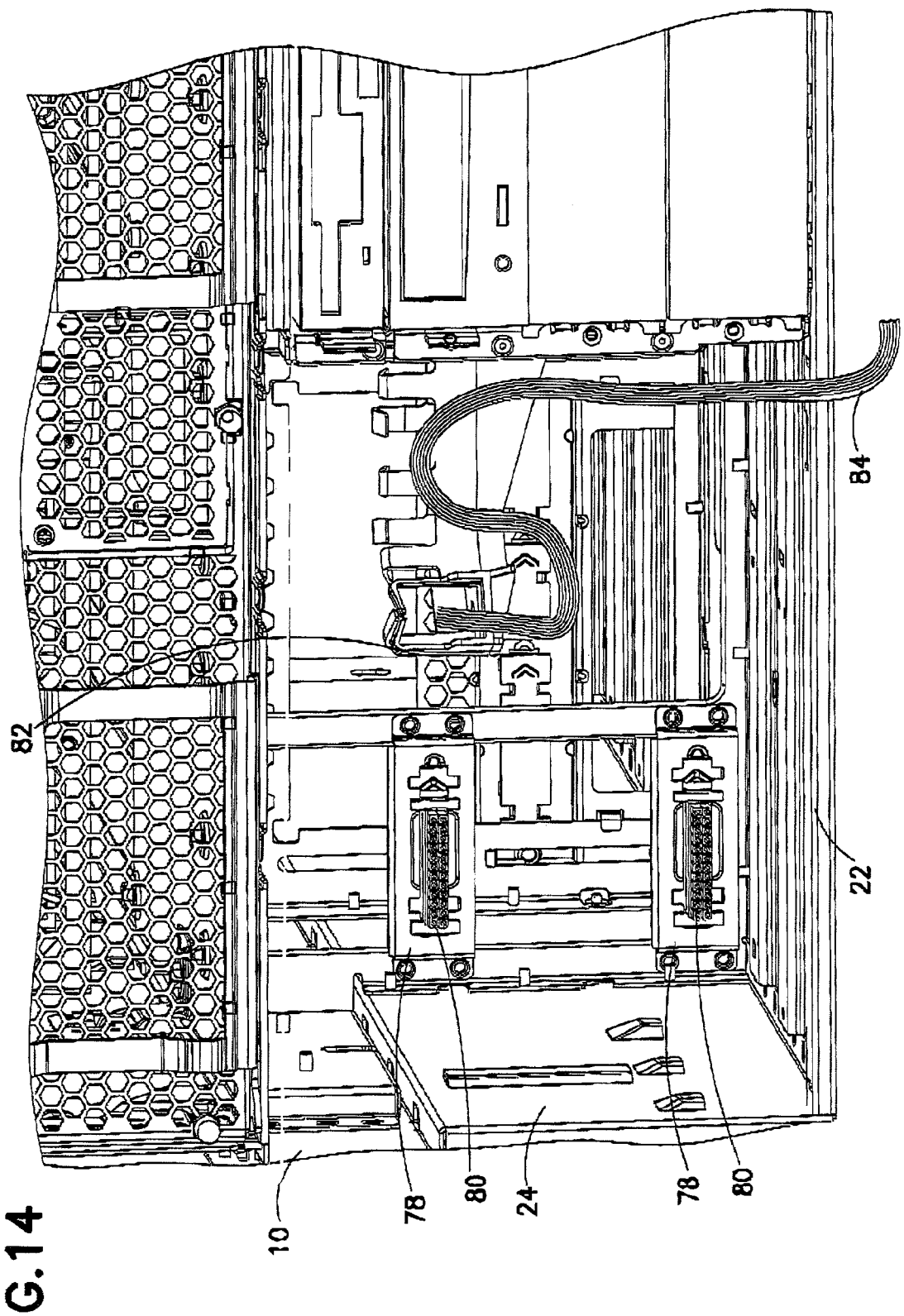
FIG. 14 is a partial perspective view of the server computer shown in FIG. 13 showing the cable management arm in a retracted position.
Figure 15:
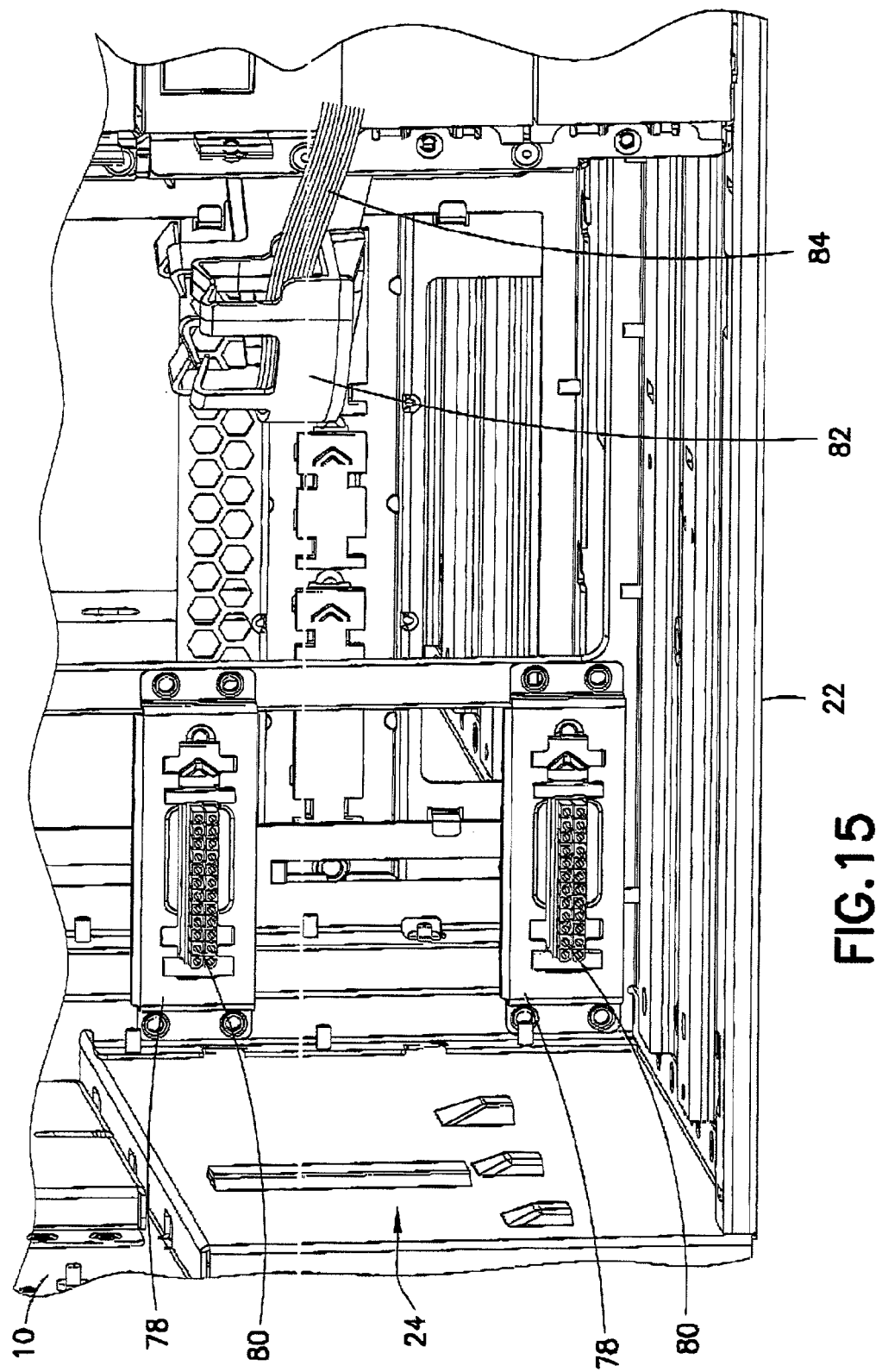
FIG. 15 is a partial perspective view as in FIG. 14 showing the cable management arm in an extended position.

Referring also to FIGS. 14 and 15, the computer housing 22 includes backplane direct docking connector mounting sections 78 connected to the housing 22 at a rear of the computer module receiving area 24. The backplane direct docking connector mounting sections 78 are adapted to have electrical connectors 80 mounted thereto to plug with mating electrical connectors 68 (see FIG. 2) of the computer module 14 when the computer module 14 is plugged into the computer module receiving area 24. In an alternate embodiment, such as when the computer module 14 is connected to the computer 10 by one or more cables 84, the connectors 80 might not be provided.

The computer 10 also includes a cable management arm 82 connected to the housing 22 at the rear of the computer module receiving area 24. The cable management arm 82 is movably connected to the housing 22. In this embodiment the cable management arm 82 is pivotably connected to the housing 22 at the rear of the receiving area 24. The cable management arm 82 is adapted to hold one or more electrical cables 84, connected between the computer 10 and the computer module 14, and controllably locate the electrical cable 84 with movement of the cable management arm 82 between a retracted position (FIG. 14) and an extended position (FIG. 15). This cable management arm can control the extra slack of the manually connected cables 84 so that the cables do not interfere with cage 34 when the cage 34 gets pushed back into the receiving area 24.

The invention described herein includes several components that solve the problems described above. The invention includes a module that is removable from a computer server, but may also be slid out of the system and rotated downward for access to components on the rear of the module. The module contains at least one handle that is used to unlock and pull the module from out of the system for access to the internal components. In order to ease re-installation of the module into the system, direct-docking connectors can be used. Accommodations are also made for manually-connected cables using an internal cable management arm to ensure the cables do not interfere with the cage as it is slid back into the system after service. This arrangement of features allows the module to be unlocked from the server, slid out of the server, and rotated downward to provide access to the components on the rear of the module. When the module is pushed back into the system, the direct-docking cable connectors, cable management arm and latch system lock the module back into the system and connect it to the rest of the server. This can provide a computer drive cage system without the need for top access.

The figures show that the hard drive cage can be pulled out of the server to provide access to the hard drive backplane. The key to this design is the handle with the camming pin on the left side of the cage. This handle serves several purposes. First, as the handle is rotated the first 30 degrees, it lifts a latch that holds the chassis in the system when the drive cage is in the locked position in the system. Then, as the handle is rotated further and the latch has raised above the bottom floor of the chassis, a camming pin cams the drive cage out to disconnect the direct-docking internal connectors from the backplane. Then, the hook feature on the end of the handle allows the operator to easily grasp it and pull the drive cage out of the system for service.

The figures show that the hard drive cage can be rotated downward exposing the hard drive backplane on the rear of the hard drive cage. The hard drive backplane can be rotated away from the hard drive cage so that it can be removed without the need for any tools. Metal spring steel latches can hold the backplane onto the drive cage during normal operation.

The figures show removal of the entire drive cage from the system. Two tabs can be lifted to allow the entire cage to be slid out of the system for drive cage replacement. This removable drive cage allows for easy future upgrade to different hard drive technologies with different backplanes without redesigning the entire system.

The system design facilitates manual or direct docking of the system to signal or power cables. The figures show the internal connectors that direct-dock to the backplane when the backplane is pushed back into the server. The power connectors on the rear of the hard drive backplanes dock into the connectors inside the system. The figures show the internal cable management arm in the pushed back position and the extended position. This cable management arm can control the extra slack of manually connected cables so that the cables do not interfere with cage when it gets pushed back into the system. However, the cable management arm might not be provided.

It should be understood that the foregoing description is only illustrative of the invention. Various alternatives and modifications can be devised by those skilled in the art without departing from the invention. Accordingly, the invention is intended to embrace all such alternatives, modifications and variances which fall within the scope of the appended claims.

What is claimed is:

1. A computer drive module comprising:
   at least one computer drive;
   a module housing having the at least one computer drive connected thereto, wherein the module housing comprises a first section adapted to be connected to a computer housing and a second section movably connected to the first section between a retracted position and an extended position, wherein the second section is adapted to pivot relative to the first section when the second section is at the extended position; and
   a backplane printed circuit board connected to a rear end of the second section of the module housing.

2. A computer drive module as in claim 1 wherein the first section of the module housing comprises at least one latch adapted to removably latch the first section of the module housing to the computer housing.

3. A computer drive module as in claim 1 wherein the first section comprises rails for the second section to slide along.

4. A computer drive module as in claim 1 wherein the rear end of the second section of the module housing comprises at least one latch for removably latching the backplane printed circuit board to the rear end.

5. A computer drive module as in claim 1 wherein the first section of the module housing is adapted to be stationarily connected to the computer housing.

6. A computer drive module as in claim 1 wherein the second section is slidably connected to the first section between the retracted position and the extended position, and wherein the second section is adapted to pivot downward relative to the first section when the second section is at the extended position.

7. A computer drive module as in claim 1 wherein a connection between the second section and the first section comprises pins at a rear of the second section located in tracks on the first section.

8. A computer drive module as in claim 1 further comprising a combined latch and lever assembly movably mounted to the module housing.

9. A computer drive module as in claim 8 wherein the combined latch and lever assembly comprises a latch member adapted to latch the computer drive module to the computer housing at a connected position and a lever member pivotably connected to the module housing, wherein when the lever member is rotated the lever member is adapted to move the latch member from a latched position to an unlatched position, and the lever member comprises a cam surface adapted to cam the lever member in a direction away from the computer housing and thereby cam the module housing in the direction away from the computer housing.

10. A computer server comprising:
    a computer drive module as in claim 1;
    a computer housing having a computer module receiving area, wherein the computer drive module is removably located in the computer module receiving area; and
    a cable management arm movably connected to the computer housing at a rear of the computer module receiving area, wherein the cable management arm is adapted to hold an electrical cable, connected between the computer server and the computer drive module, and controllably locate the electrical cable with movement of the cable management arm between a retracted position and an extended position.

11. A computer module comprising:
    a module housing adapted to be movably mounted in a receiving area of a computer housing; and
    a combined latch and lever assembly movably mounted to the module housing, wherein the combined latch and lever assembly comprises a latch member adapted to latch the computer module to the computer housing at a connected position and a lever member pivotably connected to the module housing, wherein when the lever member is rotated the lever member is adapted to move the latch member from a latched position to an unlatched position, and the lever member comprises a cam surface adapted to cam the lever member in a direction away from the computer housing and thereby cam the module housing in the direction away from the computer housing.

12. A computer module as in claim 11 wherein the latch member is slidably connected to the module housing.

13. A computer module as in claim 12 wherein the latch member is located at a lateral side of the module housing and is adapted to slide up and down.

14. A computer module as in claim 11 wherein the combined latch and lever assembly comprises a spring biasing the latch member towards the latched position.

15. A computer module as in claim 11 wherein the lever member is adapted to pivot into a forward position relative to the module housing and form a handle for pulling the computer module out of the receiving area of the computer housing.

16. A computer module as in claim 11 wherein the module housing comprises a first section adapted to be stationarily connected to the computer housing and a second section slidably connected to the first section between a retracted position and an extended position.

17. A computer module as in claim 16 wherein the second section is adapted to pivot relative to the first section when the second section is at the extended position.

18. A computer module as in claim 16 further comprising a backplane printed circuit board removably connected to a rear end of the second section of the module housing by at least one latch.

19. A computer server comprising:
    a computer module as in claim 11;
    a computer housing having a computer module receiving area, wherein the computer module is removably located in the computer module receiving area; and
    a cable management arm movably connected to the computer housing at a rear of the computer module receiving area, wherein the cable management arm is adapted to hold an electrical cable, connected between the computer server and the computer drive module, and controllably locate the electrical cable with movement of the cable management arm between a retracted position and an extended position.

20. A computer server comprising:
    a housing having a computer module receiving area adapted to removably receive a computer module therein;
    a backplane direct docking connector mounting section connected to the housing at a rear of the computer module receiving area, wherein the backplane direct docking connector mounting section is adapted to have at least one optional electrical connector mounted thereto to plug with a mating electrical connector of the computer module when the computer module is plugged into the computer module receiving area; and a cable management arm movably connected to the housing at the rear of the computer module receiving area, wherein the cable management arm is adapted to hold an optional electrical cable, connected between the computer server and the computer module, and controllably locate the electrical cable with movement of the cable management arm between a retracted position and an extended position.

* * * * *